United States Patent [19]

Sypek et al.

[11] Patent Number: 4,886,731

[45] Date of Patent: Dec. 12, 1989

[54] MULTILAYER PHOTOPOLYMERIC PRINTING PLATES WITH PHOTOREACTIVE DIAZO COMPOUNDS AND PHOTOPOLYMERIZABLE COMPOSITIONS

[75] Inventors: Maria T. Sypek, Chicopee; Thomas P. Rorke, Holyoke, both of Mass.

[73] Assignee: Cookson Graphics Inc., Holyoke, Mass.

[21] Appl. No.: 351,262

[22] Filed: May 10, 1989

Related U.S. Application Data

[63] Continuation of Ser. No. 891, Jan. 5, 1987, abandoned.

[51] Int. Cl.[4] .......................... G03C 1/52; G03C 1/60; G03C 1/70; G03C 1/94
[52] U.S. Cl. ..................................... 430/156; 430/141; 430/157; 430/158; 430/159; 430/175; 430/271; 430/272; 430/278; 430/300; 430/302; 430/502
[58] Field of Search .............. 430/141, 156, 157, 158, 430/159, 175, 271, 272, 278, 502, 300, 302

[56] References Cited

U.S. PATENT DOCUMENTS

| | | | |
|---|---|---|---|
| 3,462,267 | 8/1969 | Giangualano et al. | 430/156 |
| 3,652,272 | 12/1970 | Thomas | 430/175 |
| 3,808,004 | 3/1972 | Thomas et al. | 430/156 |
| 3,905,815 | 9/1975 | Bonham | 430/156 |
| 4,104,072 | 8/1978 | Golda et al | 430/155 |
| 4,233,390 | 11/1980 | Jargiello | 430/156 |
| 4,264,705 | 4/1981 | Allen | 430/271 |
| 4,316,949 | 2/1982 | Petrellis et al. | 430/175 |
| 4,349,620 | 9/1982 | Cyr et al. | 430/271 |
| 4,659,645 | 4/1987 | Frommeld et al. | 430/175 |

FOREIGN PATENT DOCUMENTS

| | | |
|---|---|---|
| 1153236 | 9/1983 | Canada . |
| 104863 | 4/1984 | European Pat. Off. . |
| 2044788 | 5/1983 | United Kingdom . |

*Primary Examiner*—Charles L. Bowers, Jr.
*Attorney, Agent, or Firm*—Kenyon & Kenyon

[57] ABSTRACT

Photopolymeric printing plates wherein an electrochemically etched, anodized and silicated aluminum plate has a plurality of coatings applied thereon and wherein at least one of the coatings include a solvent soluble diazo therein.

9 Claims, No Drawings

MULTILAYER PHOTOPOLYMERIC PRINTING PLATES WITH PHOTOREACTIVE DIAZO COMPOUNDS AND PHOTOPOLYMERIZABLE COMPOSITIONS

This application is a continuation of application Ser. No. 000,891, filed Jan. 5, 1987, now abandoned.

BACKGROUND OF THE INVENTION

This invention relates to printing plates. More particularly, this invention relates to photopolymeric printing plates having multiple layers and including a solvent soluble diazo.

It is well known that commercially available non-photopolymeric printing plates do not exhibit resistance to the solvents and chemicals often used on printing presses. Therefore, if these plates are exposed to such solvents and chemicals, the printing surface of the plate can be destroyed. Such non-photopolymeric printing plates could be made more solvent and chemical resistant by the use of more resistant components, but the resulting plate would be very difficult to process particularly as the plate ages between manufacture and use and especially when processed with developing solutions made with harsh, toxic solvents. Therefore, the composition of non-photopolymeric printing plates must be a compromise between solvent and chemical resistance on the one hand and processability on the other.

Since photopolymeric compositions do not exhibit solvent and chemical resistance until they are exposed to actinic radiation such compositions could be valuable in preparing a printing plate that exhibits solvent and chemical resistance while maintaining ease of processing with developers not requiring harsh, dangerous solvents. However, the use of photopolymeric compositions in preparing printing plates can produce problems, such as the lack of adhesion to the printing plate substrate and surprisingly in some cases, difficult release from the plate substrate unless harsh, toxic solvents are used in the development solution.

SUMMARY OF THE INVENTION

The above discussed and other problems and deficiencies of the prior art are overcome by the printing plate composition of the present invention. In accordance with the present invention, a photopolymeric printing plate is provided which combines the multiple layer diazo technology of non-photo polymeric plates with photopolymeric compositions to yield plates having both solvent and chemical resistance along with ease of processing in those developing solutions which do not require harsh, toxic solvents.

The photopolymer printing plate in accordance with the present invention comprises, in a first embodiment, a three layer coating on brush grained, electrochemically etched and anodized, silicated aluminum. The first layer comprises two identical coatings (called wash and basecoat) of a low concentration of water-soluble lithographic diazo stabilized with zinc chloride and citric acid. The purpose of the wash and basecoat (first layer) is to provide adhesion of the other layers to the metal substrate in the exposed areas of the plate, while allowing easy release of the coatings from the metal substrate in the non-exposed areas of the plate when the plate is developed.

The second layer contains a solvent-soluble lithographic diazo prepared from the water-soluble lithographic diazo used in the wash and basecoat. The second layer is stabilized with oxalic acid and also contains a trifunctional acrylate monomer. The second coat performs many functions. It serves to control plate speed as well as stability of the plate after coating and before use (i.e., aging characteristics of the plate). In the photo exposed areas of the plate, the diazo promotes adhesion of the topcoat to the wash/basecoat and metal substrate.

The topcoat is the final layer in the first embodiment. This third layer contains photoinitiators, functional acrylate oligomer, the same tri-functional acrylate monomer found in the second coat, a pigment pre-dispersed in a polymer binder and the same solvent-soluble diazo found in the second coat. In the photo exposed areas of the plate the photoiniators generate free-radicals. These free-radicals produce polymerization between the acrylate functional oligomer and the tri-functional acrylate monomer in both the topcoat and second coat to produce the tough, solvent-resistance printing surface. The sovlent-soluble diazo serves to control plate speed, improve adhesion and durability in the photo exposed areas of the plate and produce a visible image upon exposure. The pigment colors the topcoat, while the polymeric binder is used to bind the pigment as the pigment is dispersed.

In a second and preferred embodiment of the present invention, improvements to the first embodiment in terms of both solvent and abrasion resistance is provided. In the second embodiment, the metal substrate, wash and basecoat (first layer) remain unchanged and serve the same functions. However, in the contrast to the first embodiment, the second layer of the preferred embodiment is modified to render it photopolymeric. This is accomplished by the addition of photoinitiators, acrylated oligomer and an increase in the level of acrylated tri-functional monomer in the second coat. The photoinitiators and acrylated oligomer added to the second coat are the same ones used in the topcoat. Aside from the functions of the second layer described in the first embodiment, the photopolymeric second layer of the second embodiment generates a tough, solvent resistant photopolymer film further into the grained surface of the substrate yielding improved adhesion in the photo exposed areas of the plate.

Finally, the topcoat (third layer) of the second embodiment is modified relative to the topcoat in the first embodiment by increasing (i.e. tripling) the level of photoinitiators used therein. This change results in a more complete photopolymerization of the topcoat and improved solvent resistance.

In still a third embodiment of the present invention, a higher coating weight photopolymeric plate is provided on which exhibits good handling characteristics (nontacky, not easily marred before exposure) and good solvent and abrasion resistance (after exposure).

The above-described and other features and advantages of the present invention will be apparent to and understood by those skilled in the art from the following detailed description.

DESCRIPTION OF THE PREFERRED EMBODIMENT

The present invention relates to several embodiments of photopolymeric printing plates wherein an electrochemically etched and anodized silicated aluminum plate has a plurality of coatings applied thereon and wherein at least one of the coatings includes a solvent soluble diazo therein.

In a first three layer embodiment, two identical coatings of wash and basecoat are applied the brush grained anodized and silicated aluminum. The coatings have a low concentration of water-soluble lithographic diazo stabilized with zinc chloride and citric acid. The wash and basecoat are preferably applied in a pair of nip-set coaters with no drying between the coatings. The purpose of the wash and basecoat is to provide adhesion of the other layers to the metal substrate in the exposed areas of the plate, while allowing easy release of the coatings from the metal substrate in the non-exposed areas of the plate when the plate is developed.

The second layer contains a solvent-soluble lithographic diazo prepared from the water-soluble lithographic diazo used in the wash and basecoat. The concentration of the diazo is approximately ten times that in the wash and basecoat. The second coat is stabilized with oxalic acid and also contains a tri-functional acrylate monomer. The second coat is also preferably applied by a nip-set coater. The second coat performs many functions. It serves to control plate speed as well as the stability of the plate after coating and before use (i.e. aging characteristics of the plate). In the exposed areas of the plate, the diazo promotes adhesion of the topcoat to the wash/basecoat and metal substrate. While the second coat does not contain any photoinitiators which would effect polymerization of the tri-functional acrylate monomer, it does appear that the tri-functional acrylate monomer in the second coat interacts with the photoinitiators, acrylate oligomer and tri-functional acrylate monomer in the topcoat to polymerized in the exposed areas of the plate. This phenomena has allowed the majority of the tri-functional acrylate monomer, which is necessary to produce a tough, solvent resistant photopolymer in the exposed areas of the plate, to be formulated into the second coat. Since the tri-functional acrylate monomer is a liquid, adding the necessary amount to the topcoat porduces a tacky, easily marred plate. By putting the majority of the needed tri-functional acrylate monomer in the second coat, the top coat is non-tacky and much more mar-resistant.

The coating weights of the wash and basecoat are in order of 0.01 to 0.02 gram/square meter. The coating weight of the second coat is the same magnitude.

The topcoat is the final layer in the first embodiment of the present invention. The topcoat contains photointiators, functional acrylate oligomer, the same tri-functional acrylate monomer found in the second coat, a pigment pre-dispersed in a polymer binder and the same solvent-soluble diazo found in the second coat. In the exposed areas of the plate, the photointiators generate free-radicals. These free-radicals produce polymerization between the acrylate functional oligomer and the tri-functional acrylate monomer in both the topcoat and second coat to produce the tough, solvent-resistance printing surface. The solvent-soluble diazo serves to control plate speed, improve adhesion and durability in the exposed areas of the plate and produce a a visible image upon exposure. The pigment colors the topcoat, while the polymeric binder is used to bind the pigment as the pigment is dispersed. The topcoat is applied in a meniscus roll coater at a coating weight of 0.40 grams/square meter.

Preferred formulations for each layer of the first embodiment are as follows:

| Wash and Basecoat (First Layer) | 0/0 |
|---|---|
| deionized water | 99.322 |
| citric acid | 0.196 |
| 50% zinc chloride in water | 0.166 |
| Fairmount #4 | 0.136 |
| | 100.000 |

Fairmount #4 is the formaldehyde condensation product of diazodiphenylamine, chloride salt, and ½ zinc chloride complex manufactured by Fairmount Chemical Company, Newark, N.J.

| Second Coat Layer | 0/0 |
|---|---|
| Ethyleneglycol monomethyl ether | 72.64 |
| Photomer 4072 | 5.32 |
| Oxalic Acid | 1.50 |
| 57-D solution | 20.63 |
| | 100.00 |

Photomer 4072 is a proprietary tri-functional acrylate monomer similar to trimethyolpropane triacrylate, but with reduced skin irritation potential. It is manufactured by Diamond Shamrock Chemicals Co., Morristown, N.J.

57-D is an 11.25% solids solution of the reaction product of p-chlorobenzenesulfonic acid and Fairmount #4 (see wash and basecoat in ethyleneglycol monomethel ether.)

| Topcoat | −0/0 |
|---|---|
| Celrad 3701 | 1.75 |
| Photomer 4072 | 1.75 |
| UCI - 100 | 0.13 |
| Quantacure EPD | 0.35 |
| Michler's Ketone | 0.35 |
| 57-D solution | 5.00 |
| Ethyleneglycol monomethyl ether | 63.51 |
| Ethyleneglycol monoethyl ether | 9.75 |
| Dimethylforamide | 5.85 |
| 15% Penn Color 79R27C chip in ethyleneglycol monoethyl ether | 11.56 |
| | 100.00 |

Celrad 3701 is an acrylated bispenol-A epoxy oligomer manufactured by Celanese Specialty Resins, Louisville, KY. The Celrad 3701 and the Photomer 4072 (see second coat) are the polymerizable materials.

The photointiators are the UCI-100, Quantacure EPD and Michler's Ketone. UCI-100 is chlorothioxanthone manufactured by PMC Specialties Group Inc., Cincinnati, Ohio. Quantacure EPD is ethyl-4-dimethylaminobenzoate sold by Aceto Chemical Co. Inc., Flushing N.Y. Michler's Ketone is 4,4'-Bis (dimethylamino) benzophenone, purchased from Aldrich Chemical Co., Milwaukee WI. Pen Color 79R27C is a dispersion of 60% perylene maroon pigment dispersed in Monsanto Butvar B98. Monsanto Butvar B98 is a polyvinyl butyral polymer manufactured by Monsanto, St. Louis, MO. It is purchased as a solid chip and is made ready for use by preparing a 15% concentrate in ethyleneglycol monoethyl ether.

Formost is plate color. The perylene maroon pigment employed in this embodiment produces a red colored plate. Blue colored plates are very well accepted in the market place and therefore desireable. Thus, a blue photopolymeric plate may be formulated employing a dispersion of a blue pigment such as phthalo cyanine blue dispersed in an acrylate functional oligomer or monomer (i.e., acrylated bisphenol-A epoxy oligomer).

In a second embodiment of the present invention, improvements have been achieved relative to both the solvent and abrasion resistance of the photopolymer plate of the first embodiment without altering the appearance or other characteristic of the first embodiment.

In the second embodiment, the metal substrate and wash and basecoat remain unchanged from those of the first embodiment and serve the same functions as in the first embodiment. The second layer of the second embodiment is modified to make it photopolymeric in and of itself. This is accomplished by the addition of photoinitiators, an acrylated oligomer and an increase in the level of acrylated tri-functional monomer in the second coat. The photoinitiators and acrylated oligomer added to the second coat are preferably the same ones used in the top coat. Aside from the functions of the second coat described in conjunction with the first embodiment, the photopolymeric second coat of the second embodiments generates a tough, solvent-resistant photopolymer film further into the grained surface of the substrate yielding improved adhesion in the exposed areas of the plate. This is demonstrated by the improved solvent and abrasion resistance of the second embodiment printing plate.

The topcoat of the second embodiment is modified by tripling the level of photoinitiators used in the first embodiment. This change results in a more complete photopolymerization of the topcoat and improved solvent resistance. Surprisingly, increasing the level of photoinitiators in the topcoat does not produces the same effect when coated on the second coat of the first embodiment. In increasing the level of photoinitiators in the topcoat, a blooming problem may occur. Replacement of the Michler's Ketone with ethyl Michler's Ketone eliminates the bloom without effecting any other plate performance characteristics.

The formulations for the second layer and topcoat of the second embodiment are as follows: (Note: Only materials not described in the first embodiment will be described.)

| Second Coat | % |
| --- | --- |
| ethyleneglycol monomethyl ether | 65.00 |
| Celanese Celrad 3701 | 2.62 |
| Diamond Shamrock Photomer 4072 | 7.84 |
| PMC Chemical UCI-100 | 0.39 |
| Aceto Chemical Quantacure EpD | 1.01 |
| Aldrich Chemical Co. Michler's Ketone | 1.01 |
| oxalic acid dihydrate | 1.50 |
| 57-D | 20.63 |
| | 100.00 |

| Topcoat | % |
| --- | --- |
| ethyleneglycol monomethyl ether | 61.85 |
| ethyleneglycol monomethyl ether | 9.75 |
| dimethylforamide (DMF) | 5.85 |
| PMC Chemical UCI-100 | 0.39 |
| Aceto Chemical Quantacure EPD | 1.05 |
| Aldrich Chemical Co. ethyl Michler's Ketone | 1.05 |
| Celanese Celrad 3701 | 1.75 |
| Diamond Shamrock Photomer 4072 | 1.75 |
| 57-D | 5.00 |
| Penn Color 79R27C chip, 15% solids in ethylene glycol monoethyl ether | 11.56 |
| | 100.00 |

Coating weight of the second embodiment (all coatings) is preferably 0.55±0.05 grams/square meter.

Ethyl Michler's Ketone is 4, 4'-bis(diethylamino)benzophenone purchased from Aldrich Chemical Co., Inc., Milwaukee, Wis.

Turning now to a third embodiment of the present invention, a higher coating weight photopolymer plate which exhibits good handling characteristics (non-tacky, not easily marred before exposure) and good solvent and abrasion resistance (after exposure). A plate having increased coating weight will provide longer running times. Increasing the coating weight of the first embodiment produces tacky mar-prone plates. Addition of materials to the first embodiment topcoat to improve handling characteristics at higher coating weights results in greatly reduced solvent and abrasion resistance. The second embodiment allows somewhat more latitude in incorporating materials into the topcoat to produce good handling plates at higher coating weight, but the solvent and abrasion resistance of the plate may in some instances be unacceptable. Substitution of BASF-Inmont pigment dispersion for the Penn Color pigment dispersion has resulted in the ability to reformulate the top coat used in the second embodiment to produce a higher coating weight plate with acceptable handling characteristics and solvent/abrasion resistance.

The reformulation of the second embodiment topcoat includes substitution of A. E. Staley Stalink 106 for the Celrad 3701 and adjustment in the levels of Photomer 4072 and 57-D as well as the pigment dispersion changes. It is believed that a key feature of the third embodiment is the Stalink 106 pigment dispersion.

The metal substrate, wash and basecoat and second coat of the higher coating weight photopolymer plate design are the same as those of the improved design. The topcoat formulation is as follows:

| Higher Coating Weight Topcoat (Third Embodiment) | % |
| --- | --- |
| ethyleneglycol monomethyl ether | 85.43 |
| PMC Chemical UCI-100 | 0.39 |
| Aceto Chemical Quantacure EPD | 1.04 |
| Aldrich Chemical Co. ethyl Michler's Ketone | 1.04 |
| Diamond Shamrock Photomer 4072 | 1.27 |
| A. E. Staley Stalink 106 | 2.52 |
| 57-D | 1.87 |
| BASF-Inmont 51-076002 chip, 15% solids in ethyleneglycol monomethyl ether | 6.44 |
| | 100.00 |

Coating weight of the higher coating weight third embodiment plate (all coatings) is preferably 0.85±0.05 grams/square meter.

A. E. Staley Stalink 106 is a cellulose acetate butyrate polymer modified with acrylamido groups to make it polymerizable. It is manufactured by A. E. Staley Co., Inc., Decatur, Ill.

BASF-Inmont 51-076002 chip is 60% perylene maroon dispersed in Stalink 106. It is a solid chip and prepared for use by making a 15% solids "solution" in ethyleneglycol monomethyl ether. It is manufactured by BASF-Inmont, Bound Brook, N.J.

As discussed earlier, it may be desireable to produce a blue colored plate. A preferred method of achieving such blue coloring is by preparing the pigment dispersion in Stalink 106. Thus, substitution of BASF-Inmont 51-076001 chip (50% phthalo cyanine blue dispersed in Stalink 106) into either the second or third embodiment topcoats produces blue plates with comparable performance to red plates made with perlyene maroon pigment dispersions.

The following are non-limiting examples of the various embodiments of photopolymeric printing plates of the present invention.

EXAMPLE 1

FIRST EMBODIMENT

A suitable substrate is prepared by degreasing, mechanically and electrochemically graining, electrochemically anodizing and silicating an aluminum sheet. The substrate is "wash and base-coated" by applying the following solution twice in a pair of nip-set roller coaters with no drying between the applications.

|  | % by weight |
| --- | --- |
| deionized water | 99.322 |
| citric acid | 0.196 |
| 50% zinc chloride | 0.166 |
| Fairmount #4 | 0.316 |

The plate is dried for 30 seconds at 70° C. following the second application. The coating weight of the combined wash and basecoat is 0.01 to 0.02 grams per square meter.

The "wash and basecoated" substrate is then coated with the following "second coat or layer."

|  | % by weight |
| --- | --- |
| ethyleneglycol monomethyl ether | 72.64 |
| Diamond Shamrock Photomer 4072 | 5.32 |
| Oxalic acid | 1.50 |
| 57-D solution | 20.63 |
|  | 100.00 |

This coating is applied in a nip-set roller coater and dried for 30 seconds at 70° C. The coating weight of the second coat is 0.02 to 0.03 grams per square meter.

Finally the "wash, base and second coated" substrate is coated with the following "topcoat."

|  | % by weight |
| --- | --- |
| Celanese Celrad 3701 | 1.75 |
| Diamond Shamrock Photomer 4072 | 1.75 |
| PMC Chemical UCI-100 | 0.13 |
| Aceto Chemical Quantacure EPD | 0.35 |
| Aldrich Chemical Co. Michler's Ketone | 0.35 |
| 57-D solution | 5.00 |
| ethyleneglycol monomethyl ether | 63.51 |
| ethyleneglycol monoethyl ether | 9.75 |
| dimethylforamide | 5.85 |
| 15% Penn Color 79R27C chip in ethyleneglycol monoethyl ether | 11.56 |
|  | 100.00 |

The topcoat can be applied by any suitable technique (meyer rod, gravure coater, reverse roll coater, etc.) and is dried for 75 seconds at 70° C. The coating weight of the topcoat is 0.40 grams per square meter.

The thusly prepared plate is exposed through suitable negatives and test targets for 14 units on a Nu Arc FT26V3UP Ultra-Plus Flip-Top Platemaker equipped with HT-121 metal halide bulb. A solid step 6 on a Stouffer 21 step sensitivity guide is obtained when the plate is developed with the following developing solution.

|  | % by weight |
| --- | --- |
| deionized water | 62.8 |
| monopotassium phosphate | 0.5 |
| dipotassium phosphate | 0.5 |
| tetrapotassium pyrophosphate | 0.5 |
| sodium metabisulfite | 0.7 |
| n - propanol | 35.0 |
|  | 100.00 |

Solvent resistance of the exposed and developed plate is measured by hard rubbing of the Stouffer 21 step sensitivity guide 10 times (back and forth) with a Webril Wipe soaked with benzyl alcohol. The step guide is tripped back from a solid 6 to a solid 2. By comparison, a commercially available non-photopolymeric plate such as a Graph Coat GC-201 shows complete removal of the plate image when subjected to this solvent resistance test.

A thusly prepared and processed plate exhibits excellent ink pick-up in the imaged ares and runs clean in the non-image areas when mounted on a press producing in excess of 100,000 images with excellent reproduction quality.

EXAMPLE 2

SECOND EMBODIMENT

The aluminum substrate is prepared as in Example 1 and a wash and basecoat is applied thereto as in Example 1. The "wash and basecoated" substrate is then coated with the following "second coat."

| Second Coat | % by weight |
| --- | --- |
| ethyleneglycol monomethyl ether | 65.00 |
| Celanese Celrad 3701 | 2.62 |
| Diamond Shamrock Photomer 4072 | 7.84 |
| PMC Chemical UCI-100 | 0.39 |
| Aceto Chemical Quantacure EPD | 1.01 |
| Aldrich Chemical Co. Michler's Ketone | 1.01 |
| oxalic acid dihydrate | 1.50 |
| 57-D | 20.63 |
|  | 100.00 |

This coating is applied in a nip-set roller coater and dried for 30 seconds at 70° C. The coating weight of the second coat is 0.02 to 0.03 grams per square meter.

Finally the "wash, base and second coated" substrate is coated with the following "topcoat."

| Topcoat | % by weight |
| --- | --- |
| ethyleneglycol monomethyl ether | 61.85 |
| ethyleneglycol monoethyl ether | 9.75 |
| dimethylforamide (DMF) | 5.85 |
| PMC Chemical UCI-100 | 0.39 |
| Aceto Chemical Quantacure EPD | 1.05 |
| Aldrich Chemical Co. ethyl Michler's Ketone | 1.05 |
| Celanese Celrad 3701 | 1.75 |
| Diamond Shamrock Photomer 4072 | 1.75 |
| 57-D | 5.00 |
| Penn Color 79R27C chip, 15% solids in ethyleneglycol monoethyl ether | 11.56 |
|  | 100.00 |

The topcoat can be applied by any suitable technique (meyer rod, gravure coater, reverse roll coater, etc.) and is dried for 75 seconds at 70° C. The coating weight of the topcoat is 0.50 grams per square meter.

The thusly prepared plate is exposed through suitable negatives and test targets for 14 units on a Nu Arc FT 26V3UP Ultra-Plus Flip-Top Platemaker equipped with HT-121 metal halide bulb. A solid step 6 on a Souffer 21 step sensitivity guide is obtained when the plate is developed with the following developing solution.

|  | % by weight |
| --- | --- |
| deionized water | 62.8 |
| monopotassium phosphate | 0.5 |
| dipotassium phosphate | 0.5 |
| tetrapotassium pyrophosphate | 0.5 |
| sodium metabisulfite | 0.7 |
| n - propanol | 35.00 |
|  | 100.00 |

Solvent resistance of the exposed and developed plate is measured by hard rubbing of the Stouffer 21 step sensitivity guide 10 times (back and forth) with a Webril Wipe soaked with benzyl alcohol. The step guide is stripped back from a solid 6 to a solid 4. By comparison, a non-photopolymeric plate such as a Graph Coat CG-201 shows complete removal of the plate image when subjected to this solvent resistance test.

A thusly prepared and processed plate exhibits excellent ink pick-up in the imaged areas and runs clean in the non-image areas when mounted on a press producing in excess of 100,000 images with excellent reproduction quality.

EXAMPLE 3

THIRD EMBODIMENT

The "wash, base and second" coated plate of Example 1 is prepared in the same manner as in Example 1 with the following topcoat.

| Topcoat | % by weight |
| --- | --- |
| ethyleneglycol monomethyl ether | 85.43 |
| PMC Chemical UCI-100 | 0.39 |
| Aceto Chemical Quantacure EPD | 1.04 |
| Aldrich Chemical Co. ethyl Michler's Ketone | 1.04 |
| Diamond Shamrock Photomer 4072 | 1.27 |
| A.E. Staley Stalink 106 | 2.52 |
| 57-D | 1.87 |
| BASF-Inmont 51-076002 chip, 15% solids in ethyleneglycol monomethyl ether | 6.44 |
|  | 100.00 |

The coating weight of the topcoat is preferably 0.80 grams per square meter.

This plate yields a solid 6 on the Stouffer 21 step sensitivity guide with 12 units of exposure. Performance of the plate is identical to the plate of example I except for improved solvent resistance with no stripping of the Stouffer 21 step sensitivity guide being evidenced.

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. A printing plate comprising an aluminum substrate having a silicate coating on at least one surface thereof, said silicate coated surface having greater than two additional coating layers applied thereto, wherein the first of said additional layers comprises a water-soluble photoreactive lithographic diazo, the second of said additional layers comprises a solvent-soluble photoreactive lithographic diazo and a tri-functional acrylate monomer and the third of said layers comprises a photoinitiator, an acrylate oligomer, said tri-functional acrylate monomer and said solvent-soluble lithographic diazo, wherein a greater amount of said tri-functional acrylate monomer is in said second layer relative to said third layer, and wherein said tri-functional acrylate monomer interacts with said photoinitiator and acrylate oligomer to polymerize photo exposed areas of said plate.

2. The printing plate of claim 1 wherein said second layer further comprises said photoinitiator and said acrylate oligomer present in said third layer.

3. The printing plate of claim 2 wherein the amount of said photoinitiator in said third layer is about triple the amount of said photoinitiator in said second layer.

4. The printing plate of claim 1 wherein said substrate is grained.

5. The printing plate of claim 1 wherein said substrate is grained and etched.

6. The printing plate of claim 1 wherein said substrate is grained and anodized.

7. The printing plate of claim 1 wherein said substrate is grained, etched and anodized.

8. The printing plate of claim 1 wherein said third layer further comprises a pigment dispersed in a photopolymerizable binder.

9. The printing plate of claim 1 wherein said solvent-soluble lithographic diazo comprises the reaction product of the water soluble diazo of said first layer and p-chlorobenezenesulfonic acid.

* * * * *